United States Patent
Tai et al.

(10) Patent No.: US 11,488,985 B2
(45) Date of Patent: Nov. 1, 2022

(54) SEMICONDUCTOR DEVICE

(71) Applicant: Innolux Corporation, Miao-Li County (TW)

(72) Inventors: Ming-Jou Tai, Miao-Li County (TW); Chia-Hao Tsai, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 113 days.

(21) Appl. No.: 17/073,401

(22) Filed: Oct. 19, 2020

(65) Prior Publication Data

US 2021/0134841 A1 May 6, 2021

Related U.S. Application Data

(60) Provisional application No. 62/931,223, filed on Nov. 6, 2019.

(30) Foreign Application Priority Data

Aug. 14, 2020 (CN) .......................... 202010817820.5

(51) Int. Cl.
*H01L 27/12* (2006.01)
*H01L 23/528* (2006.01)
(Continued)

(52) U.S. Cl.
CPC .......... *H01L 27/124* (2013.01); *H01L 23/528* (2013.01); *H01L 29/4908* (2013.01); *H01L 29/78672* (2013.01)

(58) Field of Classification Search
CPC ............. H01L 27/3244; H01L 27/3272; H01L 27/3248; H01L 27/3262; H01L 29/3258;
(Continued)

(56) References Cited

U.S. PATENT DOCUMENTS 6,040,589 A * 3/2000 Zhang ............... G02F 1/136227
257/385
6,358,759 B1 * 3/2002 Hirabayashi ...... H01L 27/14609
438/69
(Continued)

FOREIGN PATENT DOCUMENTS

CN 103700675 4/2014
JP 2005031645 2/2005

OTHER PUBLICATIONS

"Office Action of China Counterpart Application", dated Jun. 29, 2022, p. 1-p. 13.

*Primary Examiner* — Galina G Yushina
(74) *Attorney, Agent, or Firm* — JCIPRNET

(57) ABSTRACT

A semiconductor device including a substrate, a polysilicon semiconductor layer, and a conductive wire is provided. The polysilicon semiconductor layer is disposed on the substrate. The conductive wire is disposed on the substrate. The conductive wire contacts the polysilicon semiconductor layer through a contact portion. The polysilicon semiconductor layer and the contact portion of the conductive wire respectively have sides aligned with each other. The semiconductor device of the disclosure has good electrical connection, mitigated contact problems, improved reliability, reduced resistivity, increased driving capability, or improved display quality.

17 Claims, 7 Drawing Sheets

(51) Int. Cl.
*H01L 29/786* (2006.01)
*H01L 29/49* (2006.01)

(58) Field of Classification Search
CPC ............. H01L 27/10882; H01L 27/124; H01L 23/528; H01L 27/0207; H01L 29/4908; H01L 29/78672; H01L 29/78633; G06F 2015/768
See application file for complete search history.

(56) References Cited

U.S. PATENT DOCUMENTS

| | | | | |
|---|---|---|---|---|
| 2006/0163653 | A1* | 7/2006 | Nishiwaki | H01L 29/41741 257/341 |
| 2009/0078970 | A1* | 3/2009 | Yamazaki | H01L 21/8221 257/E27.112 |
| 2010/0270541 | A1* | 10/2010 | Liu | H01L 27/1251 438/34 |
| 2013/0240995 | A1* | 9/2013 | Li | H01L 29/4908 257/E27.06 |
| 2015/0123114 | A1* | 5/2015 | Lim | H01L 27/1225 257/43 |
| 2018/0083133 | A1* | 3/2018 | Bayram | H01L 29/66462 |
| 2018/0197484 | A1* | 7/2018 | Moon | H01L 27/12 |
| 2018/0301475 | A1* | 10/2018 | Chien | H01L 27/14812 |

* cited by examiner

US 11,488,985 B2

SEMICONDUCTOR DEVICE

CROSS-REFERENCE TO RELATED APPLICATION

This application claims the priority benefits of U.S. provisional application Ser. No. 62/931,223, filed on Nov. 6, 2019, and China application serial no. 202010817820.5, filed on Aug. 14, 2020. The entirety of each of the above-mentioned patent applications is hereby incorporated by reference herein and made a part of this specification.

BACKGROUND

Technical Field

The disclosure relates to an electronic device, and particularly relates to an electronic device including a semiconductor device providing a good electrical connection.

Description of Related Art

Flat display panels have been widely used in electronic devices such as mobile phones, televisions, monitors, tablet computers, vehicle displays, wearable devices, and desktop computers. Along with rapid development of electronic products, requirements on display quality of the electronic products are getting higher and higher, and the electronic devices used for display are continuously developed towards display effects of a larger size and a higher resolution.

SUMMARY

The disclosure is directed to a semiconductor device, which has good electrical connection, mitigated contact problems, improved reliability, reduced resistivity, increased driving capability or improved display quality.

An embodiment of the disclosure provides a semiconductor device including a substrate, a polysilicon semiconductor layer, and a conductive wire. The polysilicon semiconductor layer is disposed on the substrate. The conductive wire is disposed on the substrate. The conductive wire contacts the polysilicon semiconductor layer through a contact portion. The polysilicon semiconductor layer and the contact portion of the conductive wire respectively have sides aligned with each other.

Based on the above description, in the semiconductor device of the disclosure, by aligning the side of the contact portion of the conductive wire with the side of the polysilicon semiconductor layer in a first opening, the contact portion and the polysilicon semiconductor layer have a good electrical connection. The semiconductor device has excellent technical effects of mitigated contact problems, improved reliability, or improved display quality. In addition, the semiconductor device is capable of reducing a circuit load, increasing driving capability or improving the display quality.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
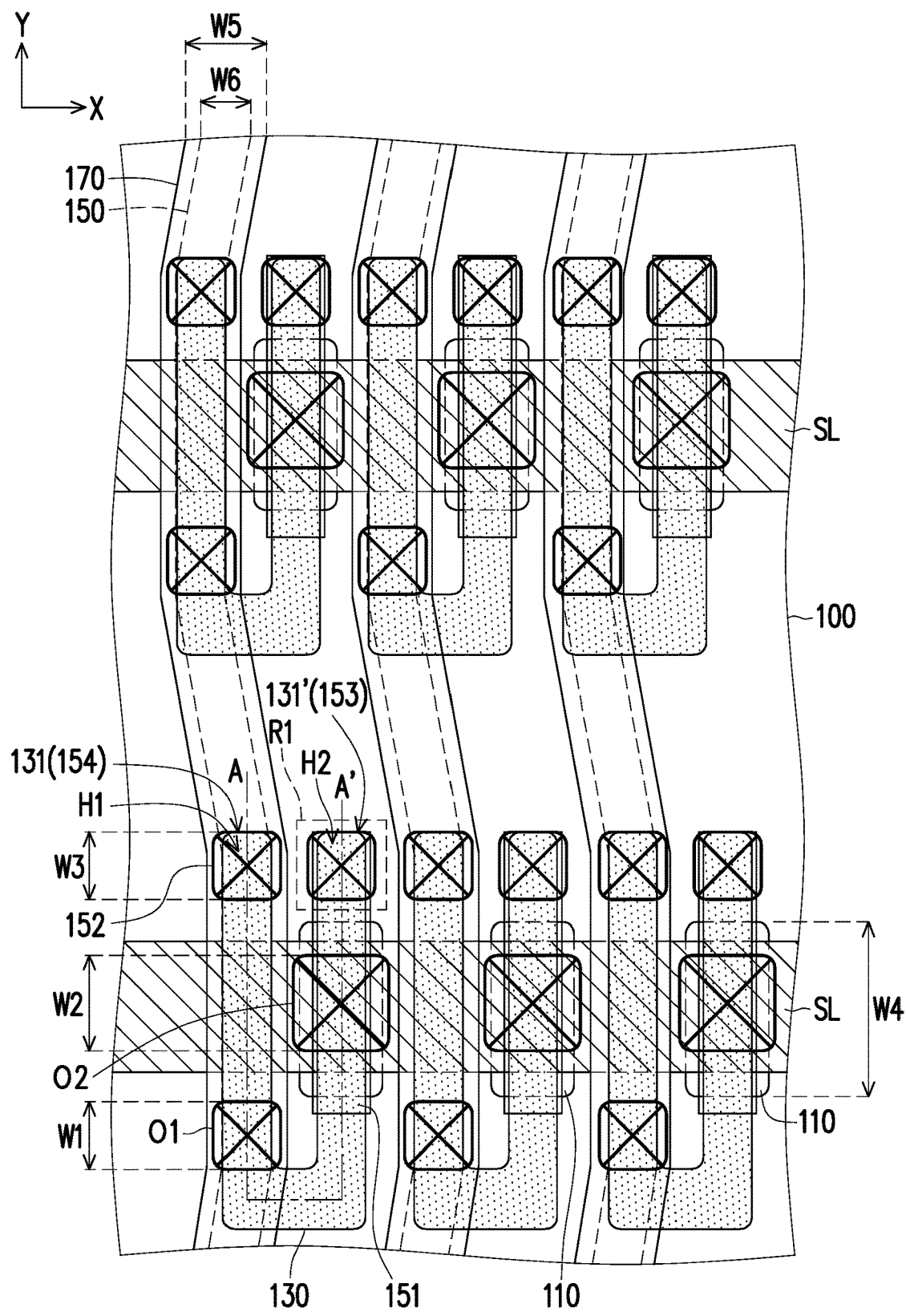
FIG. 1 is a schematic top view of a semiconductor device according to an embodiment of the disclosure.

The disclosure may be introduced with reference of the following detailed description together with the accompanying drawings. It should be noted that in order to facilitate the reader's understanding and the simplicity of the drawings, the multiple drawings in the disclosure only depict a part of an electronic device, and specific components in the drawings are not drawn according to actual scales. In addition, the number and size of each component in the figures are for illustrative only, and are not used to limit a scope of the disclosure.

Throughout the description and the appended claims of the disclosure, certain words are used to refer to specific components. Those skilled in the art should understand that electronic device manufacturers may refer to the same components by using different names. This article does not intend to distinguish those components with the same function but different names. In the following description and claims, the terms "including", "containing", and "having" are open words, so that they should be interpreted as "containing but not limited to . . . ". Therefore, when the terms "including", "containing" and/or "having" are used in the description of the disclosure, they specify existence of corresponding features, regions, steps, operations and/or components, but do not exclude existence of one or more corresponding features, regions, steps, operations and/or components.

Directional terminology mentioned in the following embodiments, such as "top," "bottom," "left," "right," "front," "back," etc., is used with reference to the orientation of the FIG(s) being described and are not intended to limit the disclosure. In the FIGs, each of the drawings depicts typical features of methods, structures, and/or materials used in the particular exemplary embodiments. However, these drawings are not to be interpreted as limiting or limiting the scope or property covered by these exemplary embodiments. For example, for clarity, relative thickness and position of each film layer, region and/or structure may be reduced or enlarged.

It should be understood that when a component or film layer is referred to as being "connected to" another component or film layer, it may be directly connected to the another component or film layer, or there may be components or film layers inserted there between. When the component is referred to as being "directly connected" to another component or film layer, none other component or film layer exits there between. In addition, when a component is referred to be "coupled to another component (or a variant thereof)", it may be directly connected to the another component, or indirectly connected (for example, electrically connected) to the another component through one or more components.

In the disclosure, the length and width may be measured by using an optical microscope, and the thickness may be obtained by measuring a cross-sectional image in an electron microscope, but the disclosure is not limited thereto. In addition, there may be a certain error between any two values or directions used for comparison.

The terms "about", "equal to", "equal" or "same", "substantially" or "approximately" are generally interpreted as being within 20% of a given value or range, or interpreted as being within 10%, 5%, 3%, 2%, 1%, or 0.5% of the given value or range.

One structure (or layer, component, substrate) described to be located on another structure (or layer, component, substrate) in the disclosure may refer to that the two structures are adjacent to each other and directly connected, or refer to that the two structures are adjacent to each other and are in indirect connection, the indirect connection means that there is at least one intermediary structure (or intermediary layer, intermediary component, intermediary substrate, intermediary space) between the two structures, and a lower surface of one structure is adjacent or directly connected to an upper surface of the intermediary structure, an upper surface of the other structure is adjacent or directly connected to a lower surface of the intermediate structure, and the intermediary structure may be composed of a single-layer or multi-layer physical structure or non-physical structure, which is not limited by the disclosure. In the disclosure, when a certain structure is disposed "on" another structure, it probably means that the certain structure is "directly" on the other structure, or the certain structure is "indirectly" on the other structure, i.e., at least one structure is sandwiched between the certain structure and the other structure.

It should be noted that although the terms "first", "second", etc. may be used for describing various elements, components, regions, layers and/or portions, the elements, components, regions, layers and/or portions are not limited by these terms. These terms are only used for separating one element, component, region, layer or portion from another element, component, region, layer or portion. Therefore, the following discussed "first element", "component", "region", "layer" or "portion" are used for separating from "second element", "component", "region", "layer" or "portion", and are not used for limiting an order or a specific element, component, region, layer and/or portion.

An electronic device may achieve a display effect through the semiconductor device of the embodiment of the disclosure, where the electronic device may include a display device, an antenna device, a sensing device, a splicing device, or a transparent display device, but the disclosure is not limited thereto. The electronic device may be a rollable, stretchable, bendable or flexible electronic device. The electronic device may include, for example, liquid crystal, light-emitting diodes (LED), quantum dots (QD), fluorescence, phosphor or other suitable materials and the materials may be arbitrarily arranged and combined, or other suitable display media, or combinations thereof; the light-emitting diode may, for example, include organic light-emitting diode (OLED), mini LED, micro LED or quantum dot (QD) LED (for example, QLED, QDLED), but the disclosure is not limited thereto. The antenna device may be, for example, a liquid crystal antenna, but the disclosure is not limited thereto. The splicing device may be, for example, a display splicing device or an antenna splicing device, but the disclosure is not limited thereto. It should be noted that the electronic device may be any arrangement and combination of the foregoing, but the disclosure is not limited thereto. In addition, an appearance of the electronic device may be rectangular, circular, polygonal, a shape with curved edges, or other suitable shapes. The electronic device may have peripheral systems such as a driving system, a control system, a light source system, a shelf system, etc., to support the display device, the antenna device, or the splicing device. Hereinafter, the semiconductor device is used to describe the content of the disclosure, but the disclosure is not limited thereto.

In the disclosure, the various embodiments described below may be mixed and matched without departing from the spirit and scope of the disclosure. For example, some features of one embodiment may be combined with some features of another embodiment to form another embodiment.

Reference will now be made in detail to the present preferred embodiments of the invention, examples of which are illustrated in the accompanying drawings. Wherever possible, the same reference numbers are used in the drawings and the description to refer to the same or like parts.

Figure 2:
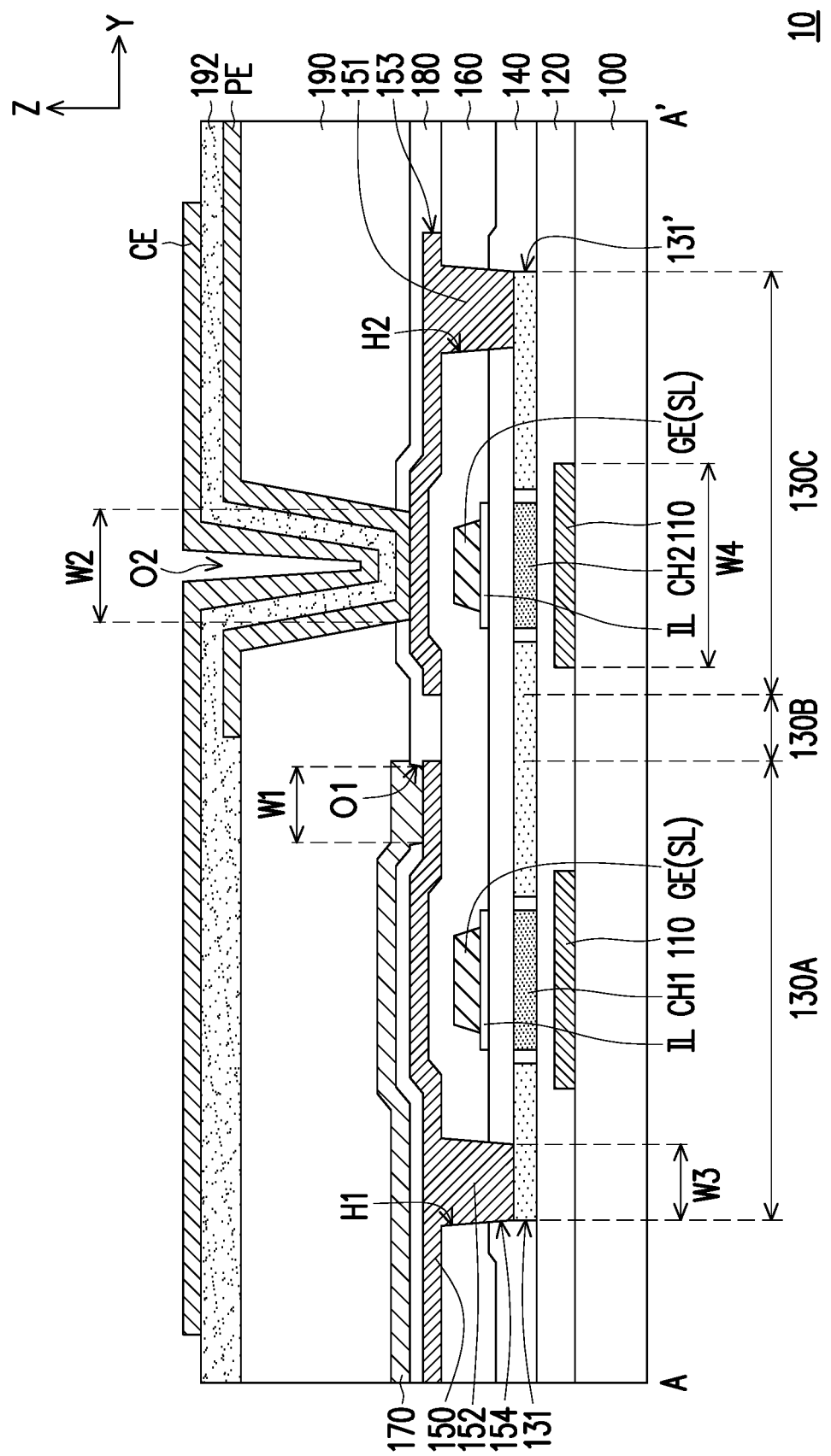
FIG. 2 is a schematic cross-sectional view of the semiconductor device of FIG. 1 viewing along a section line A-A'.
Figure 3:
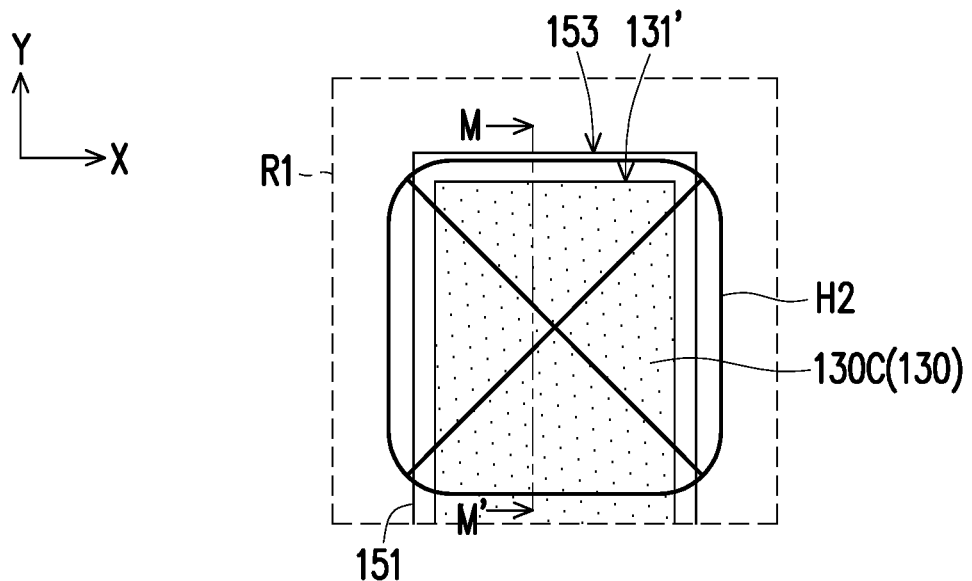
FIG. 3 is a partial enlarged schematic top view of a region R1 in FIG. 1.

FIG. 1 is a schematic top view of a semiconductor device according to an embodiment of the disclosure. For clarity of the drawing and convenience of description, several components are omitted in FIG. 1. FIG. 2 is a schematic cross-sectional view of the semiconductor device of FIG. 1 viewing along a section line A-A'. FIG. 3 is a partial enlarged schematic top view of a region R1 in FIG. 1. Referring to FIG. 1 and FIG. 2 first, the semiconductor device 10 of the embodiment is, for example, a display device suitable for displaying images, but the disclosure is not limited thereto. The semiconductor device 10 includes a substrate 100, a polysilicon semiconductor layer 130, and a conductive wire 150. The polysilicon semiconductor layer 130 is disposed on the substrate 100. The conductive wire 150 is disposed on the substrate 100. The conductive wire 150 has a contact portion 152, and the conductive wire 150 contacts the polysilicon semiconductor layer 130 through the contact portion 152 at a first hole H1. In the schematic top view of the embodiment, since a side 131 of the polysilicon semiconductor layer 130 and a side 154 of the contact portion 152 of the conductive wire 150 may be aligned with each other, the conductive wire 150 and the polysilicon semiconductor layer 130 may have a good electrical connection. Moreover, the semiconductor device 10 of the embodiment has excellent technical effects of mitigated contact problem, improved reliability, reduced resistivity, increased driving capability, or improved display quality.

In detail, as shown in FIG. 1 and FIG. 2, the semiconductor device 10 includes the substrate 100. The substrate 100 includes a rigid substrate, a flexible substrate, or a combination thereof. For example, a material of the substrate 100 may include glass, quartz, sapphire, ceramics, polycarbonate (PC), polyimide (PI), polyethylene terephthalate (PET), other suitable substrate materials, or a combination thereof, but the disclosure is not limited thereto.

Light shielding layers 110 are disposed on the substrate 100. Viewed in a normal direction of the substrate 100 (for example, a top view direction, which may also be referred to as a third direction Z), a plurality of the light shielding layers 110 may be arranged in a row along a first direction X, and the light shielding layers 110 may be arranged in columns along a second direction Y. In the embodiment, the first direction X, the second direction Y, and the third direction Z are different directions. For example, the first direction X is, for example, an extending direction of scan lines SL (for example, from left to right in FIG. 1), the second direction Y is, for example, an extending direction of the conductive wire 150, the third direction Z is, for example, the normal direction of the substrate 100, and the third direction Z is perpendicular to the first direction X and the second direction Y, respectively, but the embodiment is not limited thereto. A material of the light shielding layer 110 may include molybdenum or other suitable light shielding materials, which is not limited by the embodiment.

In the embodiment, the light shielding layer 110 is, for example, disposed corresponding to an active device of a thin film transistor (TFT) to reduce a light leakage current or mitigate a flickering problem. Configuration of the thin film transistor TFT is briefly described below. Moreover, the thin film transistor TFT may be a top gate/a bottom gate/a dual gate, but the disclosure provides no limitation thereto.

As shown in FIG. 1 and FIG. 2, the semiconductor device 10 further includes a buffer layer 120, a gate insulating layer 140, an inter-layer dielectric layer 160, a first insulating layer 180, a second insulating layer 190, a plurality of thin film transistors TFT, and a plurality of conductive wires 150 disposed on the substrate 100. To be specific, the buffer layer 120 is disposed on the substrate 100 and covers a plurality of the light shielding layers 110. The gate insulating layer 140 is disposed on the buffer layer 120. The inter-layer dielectric layer 160 is disposed on the gate insulating layer 140. The first insulating layer 180 is disposed on the inter-layer dielectric layer 160. The second insulating layer 190 is disposed on the first insulating layer 180. In the embodiment, the buffer layer 120, the gate insulating layer 140, the inter-layer dielectric layer 160, the first insulating layer 180, and the second insulating layer 190 may be a single-layer or multi-layer structure, and may include, for example, organic materials, inorganic materials, or a combination thereof. The organic materials may include polyethylene terephthalate (PET), polyethylene (PE), polyethersulfone (PES), polycarbonate (PC), polymethylmethacrylate (PMMA), polyimide (PI), photo sensitive polyimide (PSPI) or a combination thereof, and the inorganic materials may include silicon nitride, silicon oxide, silicon oxynitride or a combination thereof, but the disclosure is not limited thereto.

In the embodiment, the thin film transistors are disposed on the substrate, and each thin film transistor may be composed of the polysilicon semiconductor layer 130, a gate electrode GE, a source electrode pattern and a drain electrode pattern 151. The polysilicon semiconductor layer 130 is disposed on the buffer layer 120. Under the above configuration, the polysilicon semiconductor layer 130 may be a U-shape, but the disclosure is not limited thereto. In the embodiment, a material of the polysilicon semiconductor layer 130 is, for example, low temperature polysilicon (LTPS) but the disclosure is not limited thereto.

Referring to the schematic cross-sectional view of FIG. 2, the gate insulating layer 140 is disposed on the polysilicon semiconductor layer 130. The scan line SL is disposed on the gate insulating layer 140. In the embodiment, the scan line SL may extend along the first direction X and is overlapped with the polysilicon semiconductor layer 130 in the third direction Z. The portion of the scan line SL overlapped with the polysilicon semiconductor layer 130 may be defined as the gate electrode GE.

In the embodiment, the thin film transistor includes a dielectric layer IL disposed between the gate electrode GE and the gate insulating layer 140, but the embodiment is not limited thereto. The dielectric layer IL may have a single-layer or multi-layer structure, and may include, for example, an organic material, an inorganic material (such as silicon nitride, etc.), or a combination thereof, but the disclosure is not limited thereto. The organic material may include polyethylene terephthalate (PET), polyethylene (PE), polyethersulfone (PES), polycarbonate (PC), polymethylmethacrylate (PMMA), polyimide (PI), photo sensitive polyimide (PSPI) or a combination thereof, and the inorganic materials may include silicon nitride, silicon oxide, silicon oxynitride or a combination thereof, but the disclosure is not limited thereto.

The inter-layer dielectric layer 160 is disposed on the scan lines SL. The conductive wire 150 is disposed on the inter-layer dielectric layer 160. As shown in the schematic top view of FIG. 1, the conductive wire 150 substantially extends along the second direction Y, and as shown in the schematic cross-sectional view of FIG. 2, the conductive wire 150 is partially overlapped with the polysilicon semiconductor layer 130 in the third direction Z. The polysilicon semiconductor layer 130 includes, for example, a first part 130A, a second part 130B, and a third part 130C. The second part 130B is connected to the first part 130A and the third part 130C. In the schematic cross-sectional view of the embodiment, in the third direction Z perpendicular to the substrate 100, the conductive wire 150 is partially overlapped with the first part 130A of the polysilicon semiconductor layer 130. Referring to the schematic cross-sectional view of FIG. 2, the drain electrode pattern 151 is disposed on the inter-layer dielectric layer 160, and in the third direction Z perpendicular to the substrate 100, the drain electrode pattern 151 is partially overlapped with the third part 130C of the polysilicon semiconductor layer 130. In other words, the conductive wire 150 and the drain electrode pattern 151 are not overlapped with the second part 130B of the polysilicon semiconductor layer 130 in the third direction Z perpendicular to the substrate 100, but the disclosure is not limited thereto.

The conductive wire 150 is, for example, a data line, but the disclosure is not limited thereto. In the embodiment, the inter-layer dielectric layer 160 has a first hole H1, and the first hole H1 penetrates through the gate insulating layer 140 and is located on the first part 130A where the conductive wire 150 is overlapped with the polysilicon semiconductor layer 130. In detail, in the third direction Z, the first hole H1 is overlapped with a part of the first part 130A of the polysilicon semiconductor layer 130. The contact portion 152 of the conductive wire 150 contacts the polysilicon semiconductor layer 130 through the first hole H1. It should be noted that, in a top view, the first hole H1 having curved edge, may reduce the connection risk between the polysilicon semiconductor layer 130 and the conductive wire 150. In this way, the contact portion 152 may be used as the source electrode pattern of the thin film transistor TFT. The inter-layer dielectric layer 160 further has a second hole H2 located on the third part 130C overlapped with the drain electrode pattern 151. In detail, in the third direction Z, the second hole H2 is overlapped with a part of the third part 130C of the polysilicon semiconductor layer 130.

Referring to the schematic top view of FIG. 3, FIG. 3 is a partial enlarged view of the region R1 of FIG. 1. In the partial enlarged view of FIG. 3, the drain electrode pattern 151 may contact the polysilicon semiconductor layer 130 through the second hole H2. In the schematic top view of the embodiment, the drain electrode pattern 151 has a side 153, where the side 153 is parallel to the first direction X, and the polysilicon semiconductor layer 130 has a side 131', where the side 131' is also parallel to the first direction X, and the side 153 of the drain electrode pattern 151 and the side 131' of the polysilicon semiconductor layer 130 are aligned with each other. In the embodiment, the mutual alignment of the side 153 and the side 131' may be defined as: in the schematic top view of the embodiment, as shown in FIG. 3, a distance D between the side 153 and the side 131' in the second direction Y is less than or equal to 1 or, in the schematic cross-sectional view of the embodiment, as shown in FIG. 4, FIG. 4 is a schematic cross-sectional view of a section line M-M' of FIG. 3, the distance D between the side 153 and the side 131 in the second direction Y is less than or equal to 1 μm.

In the embodiment, the conductive wire 150, the contact portion 152, and the drain electrode pattern 151 are made of molybdenum (Mo), titanium (Ti) or a combination thereof, but the disclosure is not limited thereto. In details, in some embodiments, the material of the conductive wire 150, the contact portion 152 and the drain electrode pattern 151 may include molybdenum (Mo), titanium (Ti), aluminum (Al), tantalum (Ta), niobium (Nb), hafnium (Hf), nickel (Ni), chromium (Cr), cobalt (Co), zirconium (Zr), tungsten (W), other suitable metals, or alloys or combinations of the above materials, but the disclosure is not limited thereto.

Figure 4:
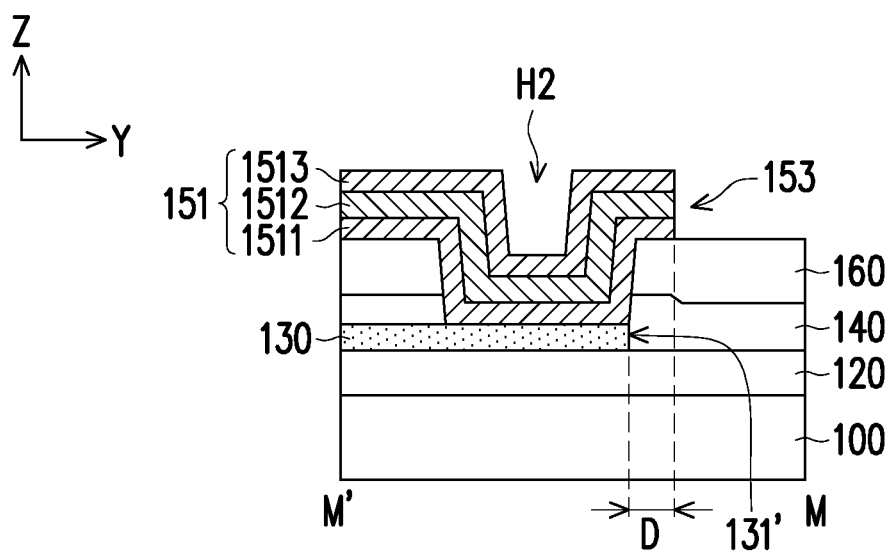
FIG. 4 is a schematic cross-sectional view of a section line M-M' of FIG. 3.

In some embodiments, referring to the schematic cross-sectional view of FIG. 4, taking the drain electrode pattern 151 as an example, the drain electrode pattern 151 may be a laminated structure formed by stacking multiple metal layers in the third direction Z, for example, the drain electrode pattern 151 may include two layers, three layers or more than three layers. In detail, the drain electrode pattern 151 may include a metal layer 1511, a metal layer 1512, and a metal layer 1513. The metal layer 1512 is disposed between the metal layer 1511 and the metal layer 1513. The metal layer 1511 contacts the polysilicon semiconductor layer 130 in the second hole H2. A material of the metal layer 1512 may be different from a material of the metal layer 1511 and the metal layer 1513. A material of the metal layer 1511 or the metal layer 1513 is, for example, titanium. A material of the metal layer 1512 is, for example, molybdenum, but the embodiment of the disclosure is not limited thereto.

Referring to FIG. 1, in order to further reduce a resistivity of the conductive wire 150, the semiconductor device 10 further includes an auxiliary conductive wire 170. The auxiliary wire 170 corresponds to the conductive wire 150, and extends substantially along the second direction Y. As shown in the schematic cross-sectional view of FIG. 2, the auxiliary conductive wire 170 is disposed on the first insulating layer 180 and is overlapped with the conductive wire 150 in the third direction Z, where the auxiliary conductive wire 170 may be, for example, a data line.

In the embodiment, as shown in the schematic cross-sectional view of FIG. 2, the first insulating layer 180 is disposed between the conductive wire 150 and the auxiliary conductive wire 170, and the first insulating layer 180 has a first opening O1. The auxiliary conductive wire 170 is electrically connected to the conductive wire 150 through the first opening O1, it should be noted that, in a top view, the first opening O1 having curved edge, may reduce the connection risk between the auxiliary conductive wire 170 and the conductive wire 150. In this way, the auxiliary conductive wire 170 may be electrically connected to the conductive wire 150. In the embodiment, the first opening O1 has a first minimum width W1 in the second direction Y. The first minimum width W1 may be defined as a width of the first opening O1 closest to the conductive wire 150 in the second direction Y. In detail, a method of measuring the minimum width of the opening or the hole of the disclosure is to measure the minimum distance between two sides of the opening or the hole in the second direction Y. Under the above configuration, the semiconductor device 10 of the disclosure may achieve a double-layer data line structure by electrically connecting the conductive wire 150 and the auxiliary conductive wire 170, thereby reducing a line resistivity.

In some embodiment, in the third direction Z perpendicular to the substrate 100 (i.e. the normal direction), the auxiliary conductive wire 170 has a width W5 in the first direction X, and the conductive wire 150 has a width W6 in the first direction X. In detail, a method of measuring the width of the conductive wire or the width of the auxiliary conductive wire of the disclosure is to measure the minimum distance between two sides of the conductive wire or the auxiliary conductive wire in the first direction X. In the embodiment of the disclosure, the width W5 is greater than or equal to 0.5 times of the width W6 and less than or equal to 1.5 times of the width W6. When the width W5 is less than 0.5 times of the width W6, the effect of reducing the resistivity of the conductive wire 150 cannot be effectively provided. When the width W5 is greater than 1.5 times of the width W6, a pixel aperture ratio is affected. Under the above configuration, in the third direction Z, a profile of the conductive wire 150 may be located within a profile of the auxiliary conductive wire 170, or the profile of the auxiliary conductive wire 170 may be located within the profile of the conductive wire 150, depending on the needs of the user.

It should be noted that since the auxiliary conductive wire 170 is made of *aurum* (Au), silver (Ag), copper (Cu), aluminum (Al) or other suitable metals, or alloys or combinations of the above materials, the auxiliary conductive wire 170 has a good resistivity. In details, the auxiliary conductive wire 170 may include *aurum* (Au), silver (Ag), copper (Cu), aluminum (Al) or other suitable metals, or alloys or combinations of the above materials, but limited thereto. Compared with the conductive wire 150, the resistivity of the auxiliary conductive wire 170 of the embodiment is less than the resistivity of the conductive wire 150. To be specific, at a temperature of 20° C., the resistivity of the conductive wire 150 is in a range from 50-55n Ω·m, while the resistivity of the auxiliary conductive wire 170 is in a range from 25-30n Ω·m, but the disclosure is not limited thereto. In addition, the semiconductor device 10 may achieve the double-layer data line structure by electrically connecting the auxiliary conductive wire 170 with the conductive wire 150, so that the line resistivity of the semiconductor device 10 may be further reduced. To be specific, when a display panel with a small pixel size still has a high resolution, a loading of its data line will be significantly higher than a loading of a data line of a display panel with a large pixel size, so that an image display may be abnormal due to the excessive load of the data line. Therefore, according to the instructions of the embodiment, by configuring a double-layer data line in the display panel with the small pixel size and through an electrical connection design the double-layer data line, impedance may be reduced or a panel driving capability is increased to meet the display need of small pixel size or high resolution. In this way, the structure design of the double-layer data line of the semiconductor device 10 may reduce the line resistivity, so that the load may be reduced, and the driving capability or the display quality of the semiconductor device 10 may be improved.

Referring to the cross-sectional view of FIG. 2, the second insulating layer 190 is disposed on the auxiliary conductive wire 170. The second insulating layer 190 has a second opening O2. In addition, the semiconductor device 10 further includes a pixel electrode PE disposed on the second insulating layer 190, a passivation layer 192 disposed on the pixel electrode PE, and a common electrode CE disposed on the passivation layer 192. The pixel electrode PE is electrically connected to the drain electrode pattern 151 through the second opening O2. In addition, the passivation layer 192 and the common electrode CE may also be partially disposed in the second opening O2. A material of the pixel electrode PE and the common electrode CE includes a transparent conductive material, such as indium tin oxide (ITO), but the disclosure is not limited thereto. The passivation layer 192 may be a single-layer or multi-layer structure, and may include, for example, organic materials, inorganic materials, or a combination thereof. The organic materials may include polyethylene terephthalate (PET), polyethylene (PE), polyethersulfone (PES), polycarbonate (PC), polymethylmethacrylate (PMMA), polyimide (PI), photo sensitive polyimide (PSPI) or a combination thereof, and the inorganic materials may include silicon nitride, silicon oxide, silicon oxynitride or a combination thereof, but the disclosure is not limited thereto.

In the embodiment, the second opening O2 has a second minimum width W2 in the second direction Y. The second minimum width W2 may be defined as a width of the second opening O2 closest to the drain electrode pattern 151 in the second direction Y. Specifically, W2 is the width of the bottom of the opening O2. In the embodiment, the first minimum width W1 is smaller than the second minimum width W2. Under the above configuration, the second opening O2 may provide an enough space for electrically connecting the pixel electrode PE to the drain electrode pattern 151 to ensure good electrical connection. In this way, the semiconductor device 10 has excellent technical effects of good electrical connection, mitigated contact problems, improved reliability or improved display quality, but the disclosure is not limited thereto.

In some embodiments, the first hole H1 has a third minimum width W3 in the second direction Y. The third minimum width W3 may be defined as a width of the first hole H1 closest to the polysilicon semiconductor layer 130 in the second direction Y. Specifically, W3 is the width of the bottom of the first hole H1. In the embodiment, the second minimum width W2 is greater than the third minimum width W3. In this way, the contact portion 152 and the polysilicon semiconductor layer 130 may have good electrical connection through the first hole H1, or the pixel aperture ratio is not affected, but the disclosure is not limited thereto.

In some embodiments, in a top view of the semiconductor device 10, the minimum width W4 of the light shielding layer 110 in the second direction Y (the extending direction of the conductive wire 150) is greater than the second minimum width W2. In detail, in the schematic cross-sectional view of the embodiment, the minimum width W4 of two sides of the light shielding layer 110 in the second direction Y is greater than the second minimum width W2. In this way, the light shielding layer 110 may prevent light coming from below the substrate 100 from directly irradiating a channel region CH2 to generate a light leakage current, or avoid affecting the drain electrode pattern 151, the pixel electrode PE or the common electrode CE, but the disclosure is not limited thereto.

Figure 5:
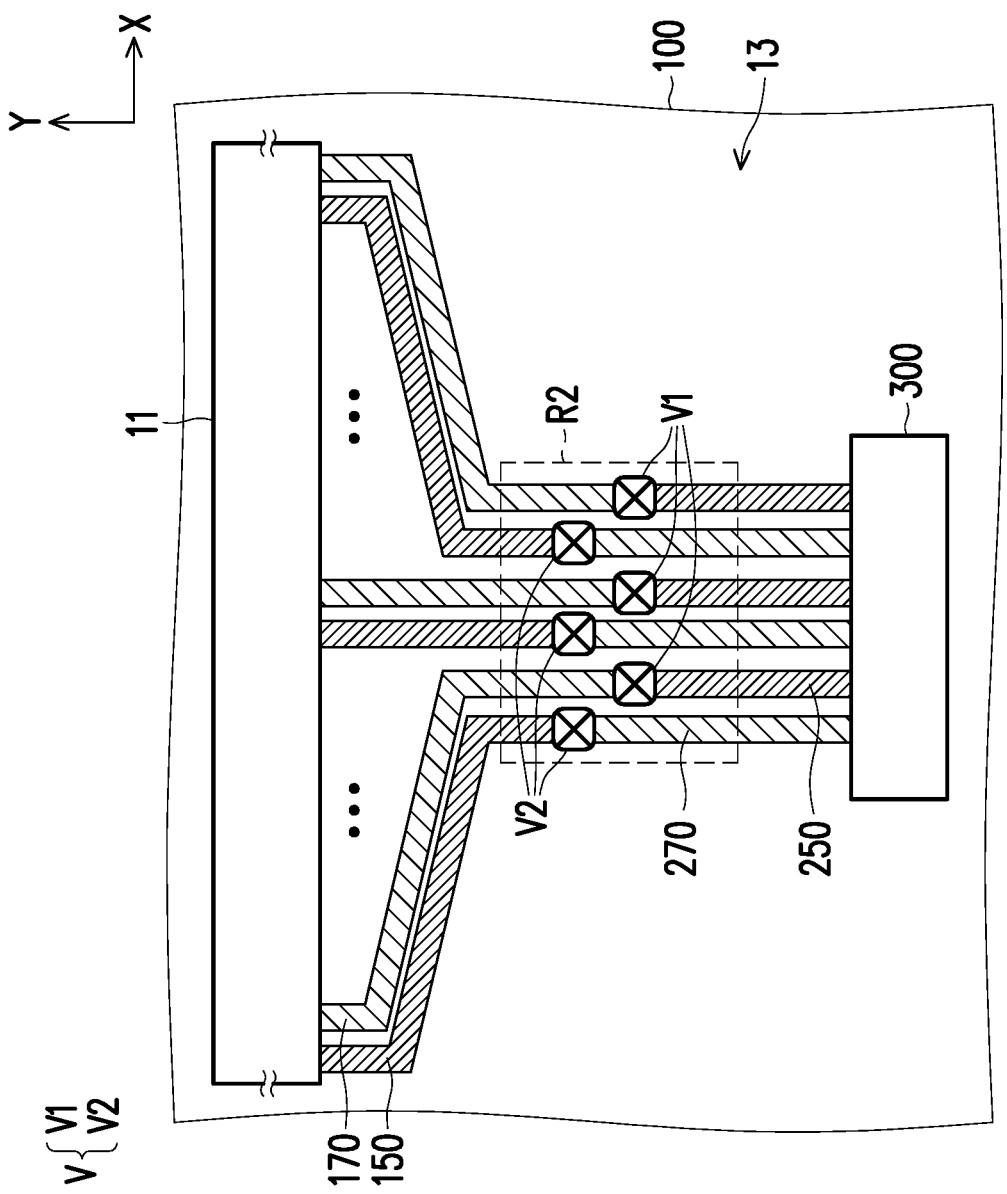
FIG. 5 is a schematic top view of a semiconductor device in a non-display region according to an embodiment of the disclosure.
Figure 6:
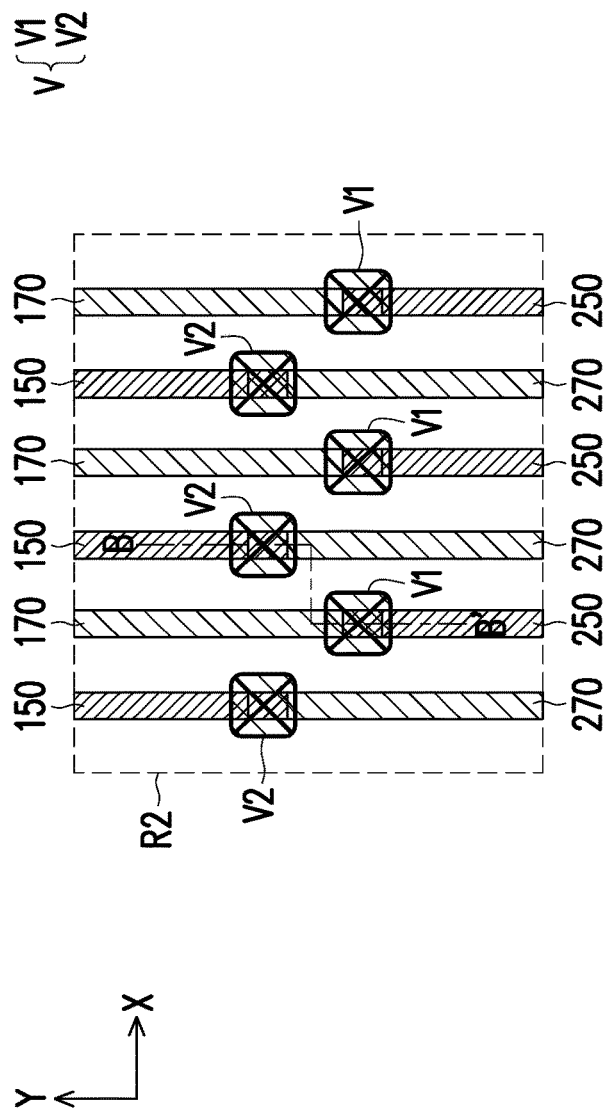
FIG. 6 is a partial enlarged schematic top view of a region R2 in FIG. 5.
Figure 7:
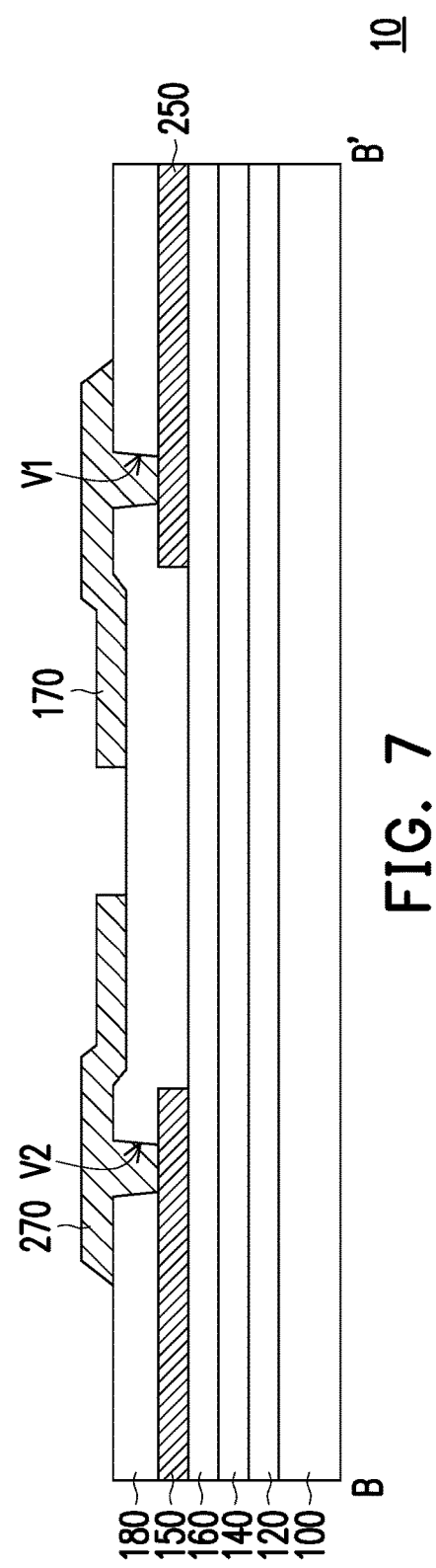
FIG. 7 is a schematic cross-sectional view of the semiconductor device of FIG. 6 viewing along a section line B-B'.

FIG. 5 is a schematic top view of a semiconductor device in a non-display region according to an embodiment of the disclosure. For clarity of the drawing and convenience of description, several components are omitted in FIG. 5. FIG. 6 is a partial enlarged schematic top view of a region R2 in FIG. 5. FIG. 7 is a schematic cross-sectional view of the semiconductor device of FIG. 6 viewing along a section line B-B'. Referring to FIG. 5, the semiconductor device 10 of the embodiment includes a display region 11 and a non-display region 13 surrounding the display region 11, which are defined on the substrate 100. The above-mentioned thin film transistors TFT, the conductive wires 150 and the auxiliary conductive wires 170 are disposed in the display region 11. The conductive wires 150 and the auxiliary conductive wires 170 may extend from the display region 11 to the non-display region 13 for electrically connecting an electronic element 300 in the non-display region 13. The electronic element 300 is, for example, an integrated circuit (IC) used for providing driving signals, a touch and display driver integration (TDDI), a chip, a flexible printed circuit (FPC), or a chip on film (COF), but the disclosure is not limited thereto.

It should be noted that the semiconductor device 10 of the embodiment further includes a conductive wire 250 and an auxiliary conductive wire 270 arranged in the non-display region 13. As shown in FIG. 7, the conductive wire 150 and the conductive wire 250 are disposed on the inter-layer dielectric layer 160. The auxiliary conductive wire 170 and the auxiliary conductive wire 270 are disposed on the first insulating layer 180, and the first insulating layer 180 is located between the conductive wire 150 (or the conductive wire 250) and the auxiliary conductive wire 170 (or the auxiliary conductive wire 270). The first insulating layer 180 further includes a plurality of third openings V, and the auxiliary conductive wire 170 is electrically connected to the conductive wire 250 through one of the third openings V, or the conductive wire 150 is electrically connected to the auxiliary conductive wire 270 through one of the third openings V. In this way, the conductive wire 150 and the auxiliary conductive wire 170 extending from the display region 11 may be connected to the electronic element 300 through the conductive wire 250 and the auxiliary conductive wire 270, so as to increase a margin of a circuit layout of the semiconductor device 10, or the semiconductor device 10 may accordingly achieve a narrow border effect or a borderless effect, but the disclosure is not limited thereto. In addition, the double-layer data line structure of the auxiliary conductive wire 170 (or the auxiliary conductive wire 270) and the conductive wire 150 (or the conductive wire 250) may reduce the line resistivity. The semiconductor device 10 has excellent technical effects of increased driving capability or improved display quality.

Moreover, as shown in the region R2 of FIG. 5 and FIG. 6, in the normal direction of the substrate 100, a plurality of the third openings V are arranged alternately along the first direction X. For example, the third openings V include a plurality of third openings V1 arranged in a row along the first direction X, and a plurality of third openings V2 arranged in another row along the first direction X. In the second direction Y, one row of the plurality of third openings V1 is close to the electronic element 300, and another row of the plurality of third openings V2 is close to the display region 11. Namely, the third openings V1 and the third openings V2 are misaligned in the second direction Y, and arranged alternately in the second direction. It should be noted that FIG. 5 and FIG. 6 show two rows of the third openings V, but the disclosure is not limited thereto. In other embodiments, the number of rows of the third openings V is not limited thereto, and the third openings V may be arranged in three, four or more rows, depending on the needs of the user.

Under the above configuration, when applied to a small-size and high-resolution display device, the semiconductor device 10 may avoid contacting and short circuit of the third openings V arranged in high circuit accuracy by arranging the third openings V alternately, and the reliability of the semiconductor device 10 may be accordingly improved.

In brief, in the schematic top view of the embodiment, in the semiconductor device 10, by aligning the side 154 of the contact portion 152 with the side 131 of the polysilicon semiconductor layer 130 in the first hole H1, the contact portion 152 and the polysilicon semiconductor layer 130 may have a good electrical connection, which may mitigate the contact problem of the semiconductor device 10, thereby achieving the excellent technical effect of improved reliability or improved display quality. Moreover, the semiconductor device 10 may achieve the double-layer data line structure by electrically connecting the conductive wire 150 with the auxiliary conductive wire 170, so as to reduce the line resistivity. Since the resistivity of the auxiliary conductive wire 170 is less than the resistivity of the conductive wire 150, the resistivity of the double-layer data line of the semiconductor device 10 may be further reduced. In this way, the semiconductor device 10 may reduce a load of the double-layer data line, increase the driving capability, or improve the display quality. In addition, since the first minimum width W1 of the first opening O1 is smaller than the second minimum width W2 of the second opening O2, and the second minimum width W2 is greater than the third minimum width W3 of the contact portion 152, the semiconductor device 10 may ensure good electrical connection, or does not affect the pixel aperture ratio. In addition, the width W4 of the light shielding layer 110 is greater than the second minimum width W2. In this way, the light shielding layer 110 may prevent generation of the light leakage current or avoid affecting the display effect. Moreover, the semiconductor device 100 further includes a conductive wire 250 and an auxiliary conductive wire 270 arranged in layers in the non-display region 13 and a plurality of third openings V arranged alternately. In this way, the conductive wire 250 and the auxiliary conductive wire 270 arranged in layers may increase a layout margin in the non-display region 13. The third openings V arranged alternately may avoid short circuits or improve reliability. The widths measured above are widths in the second direction Y.

Other embodiments are provided below for description. It should be noticed that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 8:
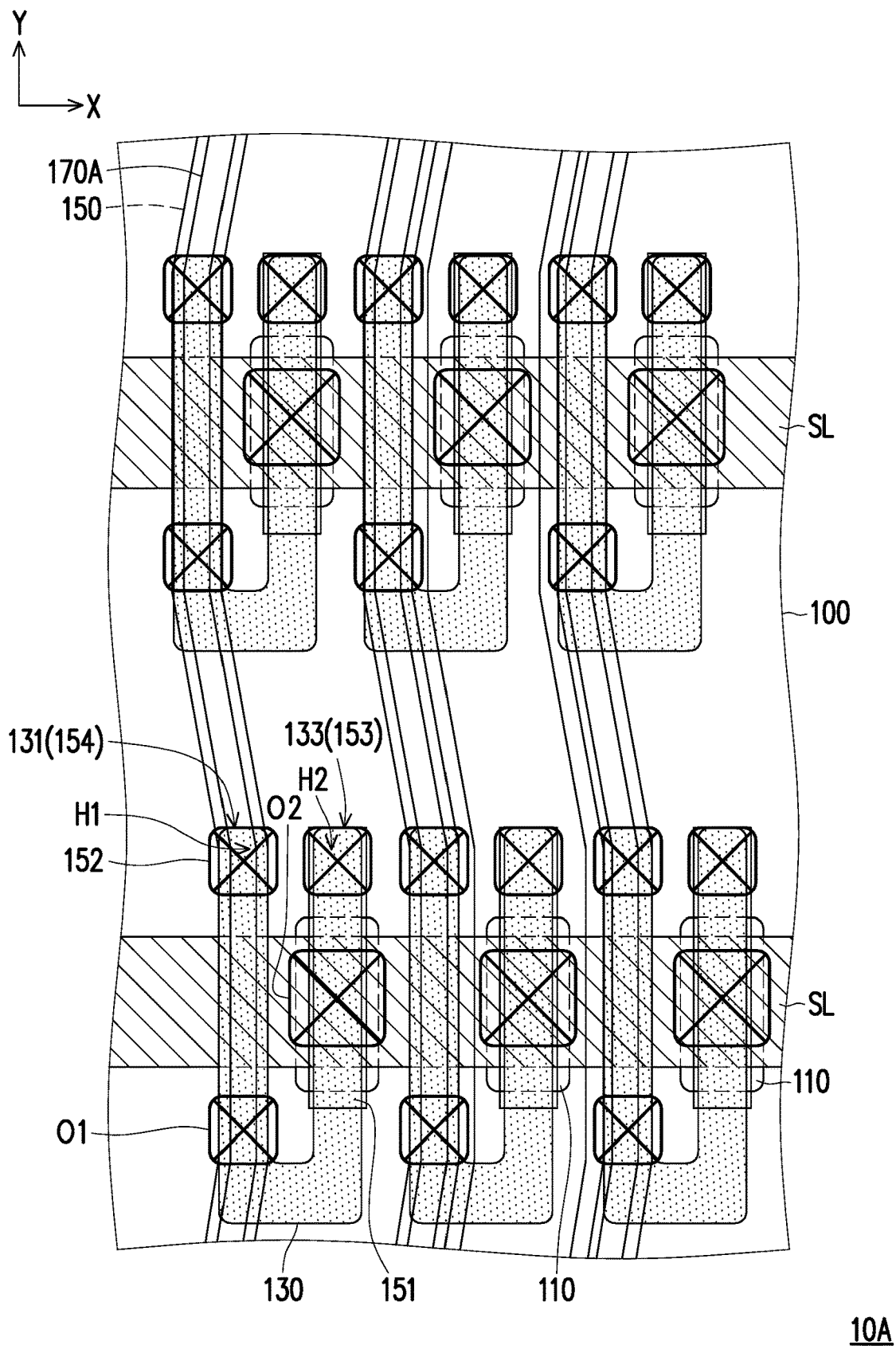
FIG. 8 is a schematic top viewing of a semiconductor device according to another embodiment of the disclosure.

FIG. 8 is a schematic top viewing of a semiconductor device according to another embodiment of the disclosure. For clarity of the drawing and convenience of description, several components are omitted in FIG. 8. The semiconductor device 10A of the embodiment is substantially similar to the semiconductor device 10 of FIG. 1, so that the same or similar components in the two embodiments are not repeated. A main difference between the semiconductor device 10A and the semiconductor device 10 is that, in the normal direction of the substrate 100, a width of an auxiliary conductive wire 170A in the first direction X is greater than or equal to 0.5 times of the width of the conductive wire 150 in the first direction X, and is smaller than the width of the conductive wire 150 in the first direction X. In this way, the semiconductor device 10A has the effect of reducing the resistivity of the conductive wire 150, or does not affect the pixel aperture ratio. In addition, the semiconductor device 10A may also obtain the excellent technical effects similar to that of the above-mentioned embodiments.

Figure 9:
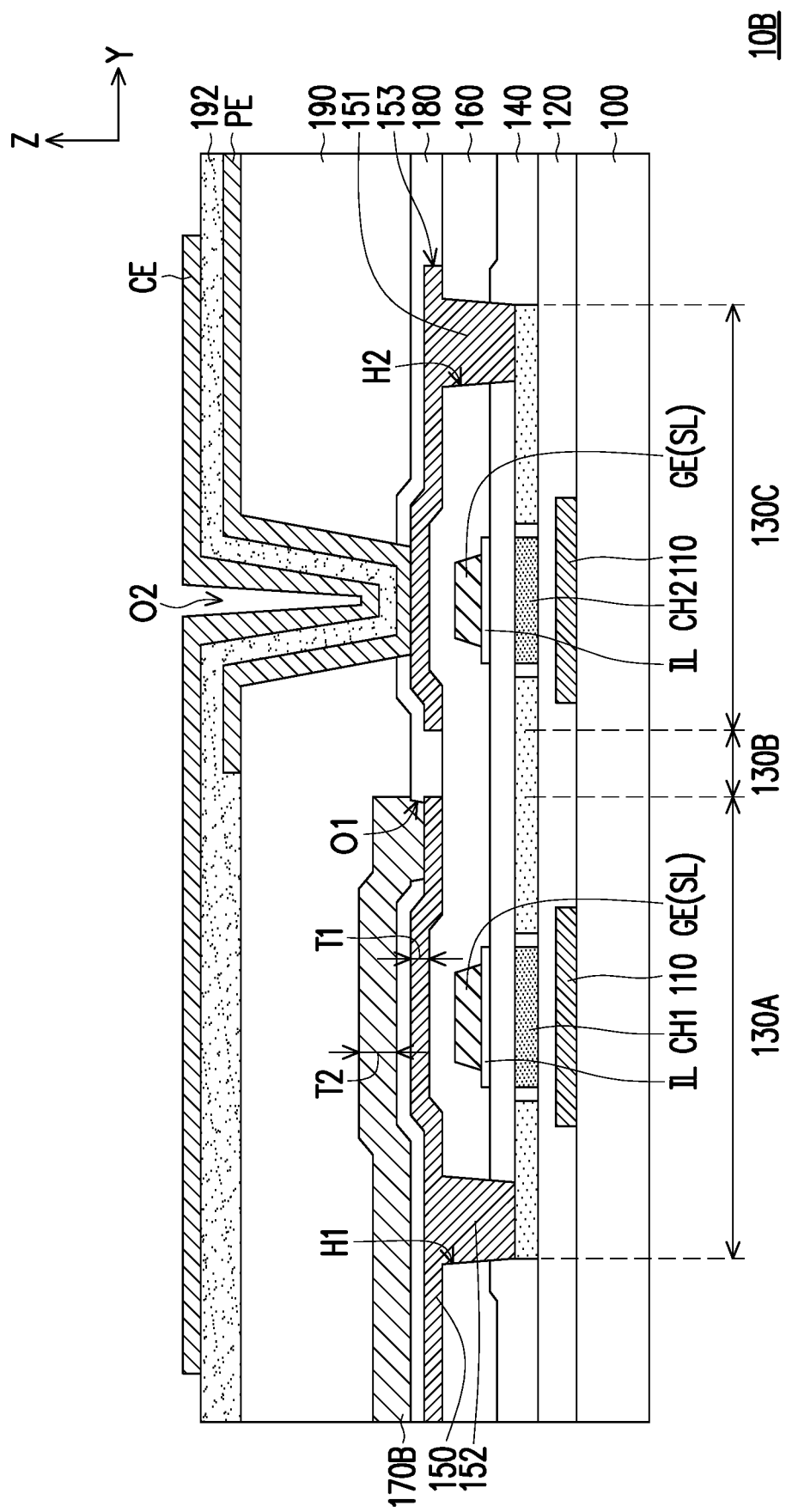
FIG. 9 is a schematic cross-sectional view of a semiconductor device according to still another embodiment of the disclosure.

FIG. 9 is a schematic cross-sectional view of a semiconductor device according to still another embodiment of the disclosure. The semiconductor device 10B of the embodiment is substantially similar to the semiconductor device 10 of FIG. 2, so that the same or similar components in the two embodiments are not repeated. A main difference between the semiconductor device 10B and the semiconductor device 10 is that, a thickness T2 of an auxiliary conductive wire 170B in the third direction Z is different from a thickness T1 of the conductive wire 150. For example, the thickness T2 may be greater than the thickness T1 and less than or equal to 3 times of the thickness T1, but the disclosure is not limited thereto. Since the resistivity of the auxiliary conductive wire 170B is less than the resistivity of the conductive wire 150, in some embodiments, when the thickness T2 of the auxiliary conductive wire 170B in the third direction Z is greater than the thickness T1 of the conductive wire 150, the resistivity of the double-layer data line may be further reduced. When the thickness T2 of the auxiliary conductive wire 170B in the third direction Z is greater than 3 times of the thickness T1, it may cause cracks or discontinuities in subsequent stacked layers, for example, may cause cracks or discontinuities in the second insulating layer 190, which may affect the stability of the electrical connection. Under the above configuration, the auxiliary conductive wire 170B may further reduce the resistivity and reduce the load of the double-layer data line, so that the semiconductor device 10B may increase the driving capability or improve the display quality. The thickness referred in the disclosure is the minimum distance from the bottom to the top of the component in the third direction Z. In addition, the semiconductor device 10B may also obtain the excellent technical effects similar to that of the above-mentioned embodiments.

In summary, in the semiconductor device of the disclosure, by aligning the side of the contact portion with the side of the polysilicon semiconductor layer in the first opening, the contact portion and the polysilicon semiconductor layer have a good electrical connection. The semiconductor device has excellent technical effects of mitigated contact problems, improved reliability, or improved display quality. In addition, the semiconductor device may achieve a double-layer data line structure by electrically connecting the conductive wire and the auxiliary conductive wire, thereby reducing line resistivity. Since the resistivity of the auxiliary conductive wire is smaller than that of the conductive wire, the resistivity of the double-layer data line of the semiconductor device may be further reduced. In this way, the semiconductor device may reduce the load of the double-layer data line, increase the driving capability, or improve the display quality. In addition, the semiconductor device may also ensure good electrical connection through the size of the opening, or does not affect the pixel aperture ratio. In addition, the light shielding layer may prevent generation of the light leakage current or avoid affecting the display effect. Moreover, the semiconductor device further includes the conductive wire and the auxiliary conductive wire arranged in layers in the non-display region and a plurality of the third openings arranged alternately. In this way, the conductive wire and the auxiliary conductive wire arranged in layers may increase the layout margin in the non-display region. The third openings arranged alternately may avoid short circuits or improve reliability. Moreover, the semiconductor device of the disclosure may also reduce the resistivity through the widths of the auxiliary conductive wire and the conductive wire, or the thickness of the conductive wire, or not affecting the pixel aperture ratio.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents. The features of the various embodiments can be mixed and matched freely as long as they do not violate the spirit of the invention or conflict with each other.

What is claimed is:

1. A semiconductor device, comprising:
   a substrate;
   a polysilicon semiconductor layer, disposed on the substrate;
   a conductive wire, disposed on the substrate, and contacting the polysilicon semiconductor layer through a contact portion;
   an auxiliary conductive wire electrically connected to the conductive wire;
   a first insulating layer disposed between the conductive wire and the auxiliary conductive wire, wherein the first insulating layer has a first opening, and the auxiliary conductive wire is electrically connected to the conductive wire through the first opening, wherein the first opening has a first minimum width W1 along a second direction, and the second direction is an extending direction of the conductive wire; and
   a second insulating layer disposed on the auxiliary conductive wire, the second insulating layer having a second opening, wherein the second opening has a second minimum width W2 along the second direction, and the first minimum width W1 is smaller than the second minimum width W2,
   wherein one side of the polysilicon semiconductor layer and one side of the contact portion of the conductive wire respectively are aligned with each other;
   wherein the contact portion has a third minimum width W3 along the second direction, and the second minimum width W2 is greater than the third minimum width W3.

2. The semiconductor device as claimed in claim 1, wherein the conductive wire comprises molybdenum, titanium or a combination thereof.

3. The semiconductor device as claimed in claim 1, wherein a resistivity of the auxiliary conductive wire is less than a resistivity of the conductive wire.

4. The semiconductor device as claimed in claim 1, wherein the auxiliary conductive wire comprises *aurum*, silver, copper, aluminum or a combination thereof.

5. The semiconductor device as claimed in claim 1, further comprising a light shielding layer, wherein in a top view of the semiconductor device, a width of the light shielding layer in the second direction is greater than the second minimum width W2.

6. The semiconductor device as claimed in claim 1, wherein in a normal direction of the substrate, a width of the auxiliary conductive wire in a first direction is 0.5 to 1.5 times of a width of the conductive wire in the first direction.

7. The semiconductor device as claimed in claim 1, further comprising a plurality of third openings, wherein the auxiliary conductive wire is electrically connected to another conductive wire through one of the third openings, another auxiliary conductive wire is electrically connected to the conductive wire through another one of the third openings, and in a normal direction of the substrate, the third openings are arranged alternately in a first direction.

8. The semiconductor device as claimed in claim 1, wherein a thickness of the auxiliary conductive wire is different from a thickness of the conductive wire.

9. The semiconductor device as claimed in claim 1, wherein the polysilicon semiconductor layer comprises a first part, a second part, and a third part, the second part is connected to the first part and the third part, wherein the conductive wire is partially overlapped with the first part.

10. The semiconductor device as claimed in claim 9, further comprising a drain electrode pattern, and the drain electrode pattern is partially overlapped with the third part.

11. The semiconductor device as claimed in claim 10, wherein a side of the drain electrode pattern is aligned with the side of the polysilicon semiconductor layer.

12. The semiconductor device as claimed in claim 10, wherein the drain electrode pattern comprises a first metal layer, a second metal layer, and a third metal layer, and the second metal layer is disposed between the first metal layer and the third metal layer, wherein a material of the first metal layer or the third metal layer is different from a material of the second metal layer.

13. The semiconductor device as claimed in claim 12, wherein the first metal layer contacts the polysilicon semiconductor layer.

14. The semiconductor device as claimed in claim 1, wherein the first opening has a curved edge.

15. The semiconductor device as claimed in claim 1, wherein the polysilicon semiconductor layer is in a U-shape in a pixel.

16. The semiconductor device as claimed in claim 1, wherein a material of the polysilicon semiconductor layer is low temperature polysilicon.

17. A semiconductor device, comprising:
   a substrate;
   a polysilicon semiconductor layer, disposed on the substrate;
   a conductive wire, disposed on the substrate, and contacting the polysilicon semiconductor layer through a contact portion; and
   an auxiliary conductive wire overlapping the conductive wire along their entire lengths and electrically connected to the conductive wire,
   wherein one side of the polysilicon semiconductor layer and one side of the contact portion of the conductive wire respectively are aligned with each other,
   wherein a thickness of the auxiliary conductive wire is greater than a thickness of the conductive wire and less than or equal to 3 times of the thickness of the conductive wire.

* * * * *